United States Patent [19]
Ichikawa et al.

[11] Patent Number: 5,434,126
[45] Date of Patent: Jul. 18, 1995

[54] THIN-FILM HIGH TC SUPERCONDUCTOR COMPRISING A FERROELECTRIC BUFFER LAYER

[75] Inventors: Yo Ichikawa, Moriguchi; Koichi Mizuno; Toshifumi Sato, both of Nara; Hideaki Adachi, Neyagawa; Kentaro Setsune, Sakai, all of Japan

[73] Assignee: Matsushita Electric Industrial Co., Ltd., Japan

[21] Appl. No.: 217,894

[22] Filed: Mar. 25, 1994

Related U.S. Application Data

[63] Continuation-in-part of Ser. No. 120,431, Sep. 14, 1993, abandoned.

[30] Foreign Application Priority Data

Sep. 29, 1992 [JP] Japan .................. 4-259448

[51] Int. Cl.⁶ .......................... H01L 39/24; B32B 9/00
[52] U.S. Cl. ................... 505/238; 505/239; 505/190; 505/702; 428/930; 428/702; 427/62
[58] Field of Search ............... 505/238, 239, 701, 702, 505/329, 190; 427/62, 63; 428/930, 702, 700, 701, 689

[56] References Cited

U.S. PATENT DOCUMENTS

| | | | |
|---|---|---|---|
| 5,135,906 | 8/1992 | Harada et al. | 505/701 |
| 5,155,658 | 10/1992 | Inam et al. | 361/321 |

FOREIGN PATENT DOCUMENTS

| | | |
|---|---|---|
| 0410868 | 1/1991 | European Pat. Off. . |
| 0412199 | 2/1991 | European Pat. Off. . |
| 1-241874 | 9/1989 | Japan . |
| 2-120229 | 5/1990 | Japan . |
| 2-122065 | 5/1990 | Japan . |
| 2-167827 | 6/1990 | Japan . |
| 2-170308 | 7/1990 | Japan . |
| 2-172821 | 7/1990 | Japan . |
| 3-082749 | 4/1991 | Japan . |

OTHER PUBLICATIONS

Golden et al, "Metalorganic deposition of high critical current thin films in the Bi-Sr-Ca-Cu-O system on {100} LaAlO₃ substrates", Appl. Phys. lett. 61(3) Jul. 1992, pp. 351-353.

Ramesh et al, "Epitaxial cuprate superconductor/ferroelectric heterostructures" Science, 252 (5008), 1991, pp. 944-946.

Journal of Applied Physics., vol. 69, No. 1, 1 Jan. 1991, New York US, pp. 404-408, A. Huanosta et al.

Ferroelectrics, vol. 96, 1989, London GB, pp. 281-285, M. Takashige et al.

Journal of Crystal Growth., vol. 115, No. 1/4, Dec. 1991, Amsterdam NL, pp. 765-768, M. Akinaga et al.

Applied Physics Letters., vol. 59, No. 14, 30 Sep. 1991, New York US, pp. 1782-1784, R. Ramesh et al.

Applied Physics Letters., vol. 54, No. 26, 26 Jun. 1989, New York US, pp. 2719-2721, A. Mogro-Campero et al.

"Possible High Tc Superconductivity in the Ba-La-Cu-O System" by Bendnorz et al.; Z. Phys. B-Condensed Matter 64, 189-193 (1986).

"A New High-Tc Oxide Superconductor without a Rare Earth Element" by Maeda et al; Japanese Journal of Applied Physics, vol. 27, No. 2, Feb., 1988; pp. L 209 and L 210.

Primary Examiner—Roy V. King
Attorney, Agent, or Firm—Parkhurst, Wendel & Rossi

[57] ABSTRACT

A thin-film superconductor includes a substrate, a ferroelectric film, and a superconducting oxide film. The ferroelectric film extends on the substrate. The ferroelectric film is made of a crystal contains Bi and O. The superconducting oxide film extends on the ferroelectric film, and containing Bi, Cu, and an alkaline-earth metal element. The superconducting oxide film may contain at least two different alkaline-earth metal elements.

18 Claims, 4 Drawing Sheets

FERROELECTRIC FILM

THIN-FILM HIGH TC SUPERCONDUCTOR COMPRISING A FERROELECTRIC BUFFER LAYER

This is a continuation-in-part of U.S. patent application, Ser. No. 120,431, filed on Sep. 14, 1993, now abandoned.

BACKGROUND OF THE INVENTION

1. Field of the Invention

This invention relates to a thin-film superconductor. This invention also relates to a method of fabricating a thin-film superconductor.

2. Description of the Prior Art

J. G. Bednorz and K. A. Muller discovered a high-Tc superconductor including a perovskite compound of the Ba—La—Cu—O system (J. G. Bednorz and K. A. Muller: Zeitshrift Fur Physik B, Condensed Matter, Vol. 64, 189-193, 1986).

H. Maeda, Y. Tanaka, M. Fukutomi, and T. Asano discovered a superconductor of the Bi—Sr—Ca—Cu—O system which had a temperature Tc of higher than 100K (H. Maeda, Y. Tanaka, M. Fukutomi, and T. Asano: Japanese Journal of Applied Physics, Vol. 27, L209-L210, 1988).

There are several different crystal phases of Bi—Sr—Ca—Cu—O superconductors which have different temperatures Tc respectively. Generally, it has been difficult to make a thin film of a Bi—Sr—Ca—Cu—O superconductor in a crystal phase having a temperature Tc of higher than 100K. The reason for the difficulty is as follows. Bi—Sr—Ca—Cu—O compounds have laminated structures in which quasi-perovskite layers of Sr—Ca—Cu—O extend between layers of $Bi_2O_2$. The quasi-perovskite layers usually assume several different phases so that the compounds tend to be out of single crystals. Thus, it is hard to make a thin-film single crystal of a Bi—Sr—Ca—Cu—O compound having a temperature Tc of higher than 100K.

U.S. Pat. No. 5,135,906 discloses a superconducting thin film of the Bi—Sr—Ca—Cu—O system, and a $Bi_2O_3$ buffer layer interposed between the superconducting thin film and a substrate of MgO, $SrTiO_3$, or YSZ.

Japanese published unexamined patent application 2-172821 discloses a thin-film superconductor of the Bi—Sr—Ca—Cu—O system which extends on a composite oxide substrate of $(Bi_2O_2)^{2+}(A_{n-1}R_nO_{3n+1})^{2-}$ where "A" denotes perovskite-structure A-site ion selected from K, Na, Li, Bi, Mg, Sr, Ca, Ba, Y, La, and other rare earth metal elements, and "R" denotes perovskite-structure B-site ion selected from Ti, Nb, Cu, Ni, and Cr. An example of the substrate is made of $Bi_4Ti_3O_{12}$. In an embodiment disclosed by Japanese application 2-172821, the thin-film superconductor is epitaxially formed on a (110)-plane of the substrate. In another embodiment disclosed by Japanese application 2-172821, the substrate is cut along a plane inclined with respect to the c-axis, and the thin-film superconductor is formed on that plane of the substrate. In Japanese application 2-172821, the superconductor and the substrate are similar in crystal structure, so that the superconductor can be well orientated according to the orientation of the substrate and hence the superconductor can easily be in a desired single phase.

SUMMARY OF THE INVENTION

It is an object of this invention to provide an improved thin-film superconductor.

It is another object of this invention to provide a method of fabricating an improved thin-film superconductor.

A first aspect of this invention provides a thin-film superconductor comprising a substrate; a ferroelectric film extending on the substrate and being made of a crystal containing Bi and O; and a superconducting oxide film extending on the ferroelectric film and containing Bi, Cu, and an alkaline-earth metal element.

The superconducting oxide film may contain at least two different alkaline-earth metal elements.

The substrate is preferably made of a crystal selected from the group of a crystal of $LaAlO_3$, a crystal of MgO, a crystal of $SrTiO_3$, a crystal of $\alpha$-$Al_2O_3$, a crystal of $MgAl_2O_4$, a crystal of YSZ, a crystal of $LaGaO_3$, a crystal of $NdGaO_3$, a crystal of $YAlO_3$, a crystal of Si, and a crystal of GaAs, a crystal of $LaSrGaO_4$, a crystal of $NdSrGaO_4$, a crystal of $PrGaO_3$, and a crystal of $PrAlO_3$.

The substrate may be made of a (100)-oriented crystal of $LaAlO_3$.

It is preferable that a boundary between the ferroelectric film and the superconducting oxide film extends along a plane nonperpendicular to a c-axis of one of the ferroelectric film and the superconducting oxide film.

It is preferable that a boundary between the ferroelectric film and the superconducting oxide film extends along a plane nonparallel to both a c-axis of the ferroelectric film and a c-axis of the superconducting oxide film.

It is preferable that the crystal of the ferroelectric film further contains Ti.

The crystal of the ferroelectric film may comprise a crystal of $Bi_4Ti_3O_{12}$ or a crystal of $Bi_2WO_6$.

It is preferable that a boundary between the ferroelectric film and the superconducting oxide film extends along a plane inclined at a predetermined angle with respect to a plane perpendicular to a c-axis of the ferroelectric film, and the angle is greater than 0 degrees but equal to or smaller than 10 degrees.

It is most preferable that a boundary between the ferroelectric film and the superconducting oxide film extends along a plane inclined at a predetermined angle with respect to a plane perpendicular to a c-axis of the ferroelectric film, and the angle is in a range of 2 degrees to 8 degrees.

A second aspect of this invention provides a thin-film superconductor comprising a ferroelectric film extending on the substrate and being made of a crystal containing Bi and O; and a superconducting oxide film extending on the ferroelectric film and containing Bi, Cu, and an alkaline-earth metal element; wherein a boundary between the ferroelectric film and the superconducting oxide film extends along a plane nonparallel to both a c-axis of the ferroelectric film and a c-axis of the superconducting oxide film.

The superconducting oxide film may contain at least two different alkaline-earth metal elements.

It is preferable that the boundary between the ferroelectric film and the superconducting oxide film extends along a plane nonperpendicular to the c-axis of one of the ferroelectric film and the superconducting oxide film.

It is preferable that the crystal of the ferroelectric film further contains Ti.

The crystal of the ferroelectric film may comprise a crystal of $Bi_4Ti_3O_{12}$ or a crystal of $Bi_2WO_6$.

It is preferable that the boundary between the ferroelectric film and the superconducting oxide film extends along the plane which is inclined at a predetermined angle with respect to a plane perpendicular to the c-axis of the ferroelectric film, and the angle is greater than 0 degree but equal to or smaller than 10 degrees.

It is most preferable that the boundary between the ferroelectric film and the superconducting oxide film extends along the plane which is inclined at a predetermined angle with respect to a plane perpendicular to the c-axis of the ferroelectric film, and the angle is in a range of 2 degrees to 8 degrees.

A third aspect of this Invention provides a method of fabricating a thin-film superconductor which comprises the steps of periodically laminating an oxide layer containing Bi and an oxide layer containing Bi and Ti on a substrate to form a ferroelectric single-crystal film on the substrate; and periodically laminating an oxide layer containing Bi and an oxide layer containing Cu and an alkaline metal element on a surface of the ferroelectric film to form a superconducting oxide film on the surface of the ferroelectric film, wherein the surface of the ferroelectric film extends along a plane nonperpendicular to a c-axis of the ferroelectric film.

It is preferable that each of the laminating steps comprises executing vapor deposition by sputtering.

It is preferable that the vapor-deposition executing step comprises executing vapor deposition which uses at least two different sources to be vaporized.

A fourth aspect of this invention provides a method of fabricating a thin-film superconductor which comprises the steps of preparing a substrate which can exhibit phase transition; forming a ferroelectric film on the substrate while heating the substrate at a temperature at which the phase transition occurs; and forming a superconducting oxide film on the ferroelectric film.

It is preferable that each of the forming steps comprises executing vapor deposition by sputtering.

DESCRIPTION OF THE PREFERRED EMBODIMENTS

Figure 1:
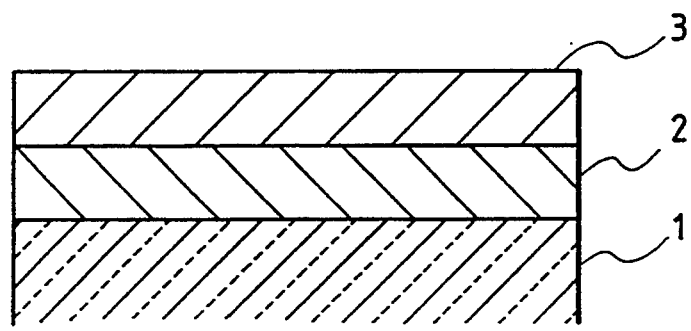
FIG. 1 is a sectional diagram of a first example of a thin-film superconductor according to this invention.

Generally, superconducting oxide films are formed, by vapor deposition, on substrates heated at a temperature in the range of 400° C. to 700° C. Then, the superconducting films are subjected to a heat treatment or a thermal process at a temperature in the range of 700° C. to 950° C. to improve superconducting characteristics thereof.

Usually, films of superconducting oxides which have a thickness of 1,000 angstroms or less are approximately equal in Tc to bulk shapes of fired superconducting oxides. The zero resistance temperature of such a film is generally lower than the zero resistance temperature of a bulk shape.

According to the results of experiments, the zero resistance temperature of a film of Bi—Sr—Ca—Cu—O superconductor which had a thickness of several hundreds of angstroms was 80K or less while the zero resistance temperature of a bulk shape of fired Bi—Sr—Ca—Cu—O superconductor was about 105K. It was found that, in a superconducting oxide film on a substrate, elements of the substrate diffused into the film via the boundary therebetween and damaged the crystal structure of the film.

Bi-based ferroelectrics, typically a ferroelectric of $Bi_4Ti_3O_{12}$, have crystal structures in which a quasi-perovskite layer is sandwiched between $Bi_2O_2$ layers as in a crystal of Bi—Sr—Ca—Cu—O superconductor. In addition, the a-axis (or b-axis) unit lengths of the crystals of the Bi-based ferroelectrics are approximately equal to that of the crystal of the Bi—Sr—Ca—Cu—O superconductor. Furthermore, the crystals of the Bi-based ferroelectrics have melting points of about 1,000° C. and are stable in wide temperature ranges. In view of these facts, the inventors have investigated a lamination of a Bi—Sr—Ca—Cu—O superconducting film and a Bi-based ferroelectric film. As a result, the inventors have discovered that a Bi—Sr—Ca—Cu—O superconducting film can be stably grown on a Bi-based ferroelectric film by epitaxy. In addition, the inventors have found that the critical current density in a Bi—Sr—Ca—Cu—O superconducting film on a Bi-based ferroelectric film is higher than the critical current density in a Bi—Sr—Ca—Cu—O superconducting film directly formed on a substrate other than a Bi-based ferroelectric film. The equality in a-axis unit length between the Bi-based ferroelectric crystal and the Bi—Sr—Ca—Cu—O superconducting crystal, and the thermal stability of $Bi_2O_2$ layers are thought to prevent elements from diffusing between the two films via the boundary.

The inventors have discovered that improved superconducting characteristics are given by a Bi—Sr—Ca—Cu—O superconducting film formed on a crystal plane of a Bi-based ferroelectric film which is not perpendicular to the c-axis. Thus, a crystal of $LaAlO_3$ which could exhibit a phase transition was used as a substrate, and a $Bi_4Ti_3O_{12}$ film was formed on the substrate. It was found that a $Bi_4Ti_3O_{12}$ film, which was formed when a substrate was heated at a temperature of 600° C., had a stepped surface. Generally, the temperature of the phase transition of a crystal of $LaAlO_3$ is in the range of 550° C. to 650° C. It is though that the phase transition of the $LaAlO_3$ substrate occurs during the formation of the $Bi_4Ti_3O_{12}$ film, and the surface of the resultant $Bi_4Ti_3O_{12}$ film is stepped by the occurrence of the phase transition of the $LaAlO_3$ substrate. According to observation by x-ray diffraction, it was found that the $Bi_4Ti_3O_{12}$ film was grown while being inclined with respect to the substrate surface by an angle of about 5 degrees. Finally, a Bi—Sr—Ca—Cu—O superconducting film was formed on the $Bi_4Ti_3O_{12}$ film to complete a thin-film superconductor. The thin-film superconductor including the substrate, the $Bi_4Ti_3O_{12}$ film, and the Bi—Sr—Ca—Cu—O superconducting film was better in superconducting characteristics than a thin-film superconductor having a Bi—Sr—Ca—Cu—O superconducting film directly formed on a substrate.

Figure 7:
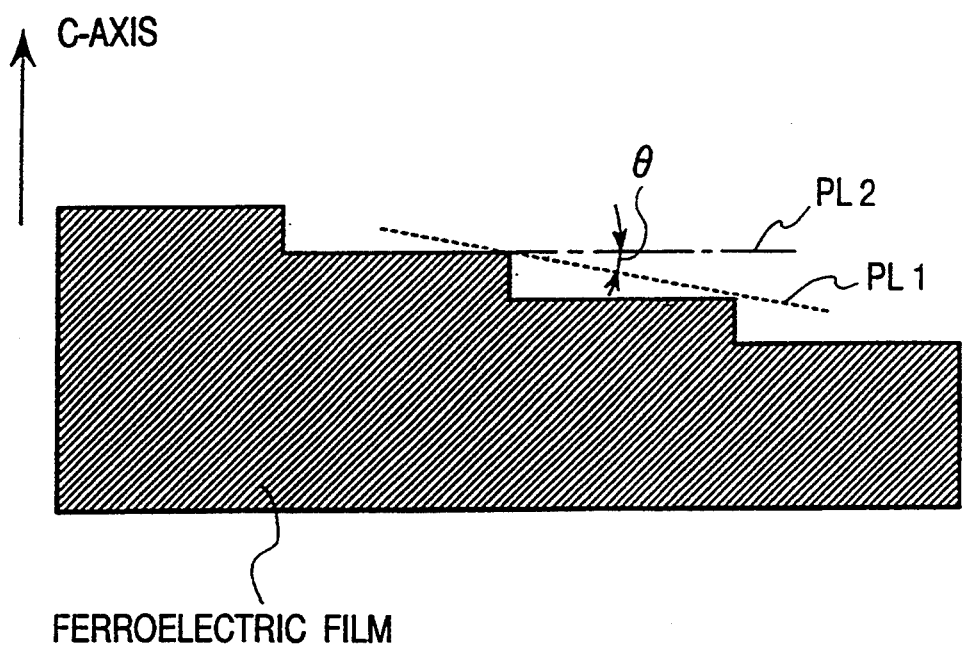
FIG. 7 is a sectional diagram of a Bi-based ferroelectric film in a thin-film superconductor according to this Invention.

During the fabrication of a thin-film superconductor, after a Bi-based ferroelectric film is formed on a substrate, the Bi-based ferroelectric film may be cut along a plane PL1 which is inclined at an angle $\theta$ with respect to a plane PL2 perpendicular to the c-axis of a crystal of the Bi-based ferroelectric film as shown in FIG. 7. Generally, the inclined surface of the Bi-based ferroelectric film is stepped. Subsequently, a Bi—Sr—Ca—Cu—O superconducting film is formed on the Bi-based ferroelectric film.

Figure 8:
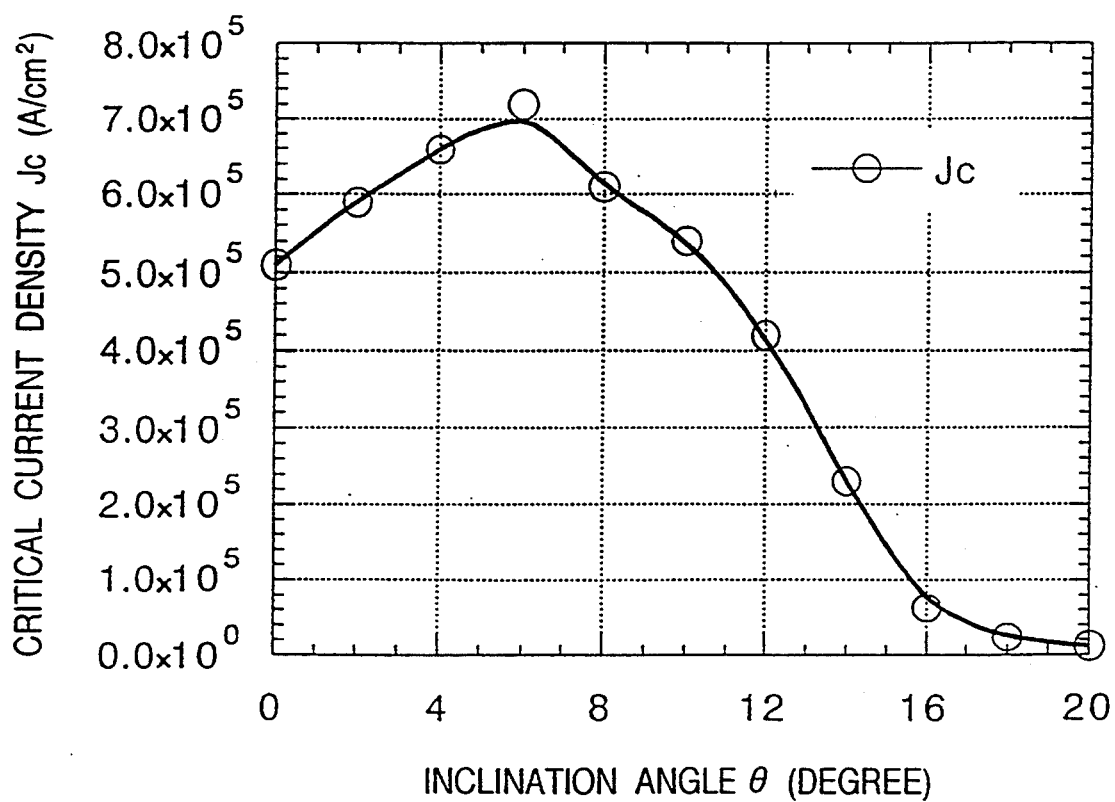
FIG. 8 is a diagram of the relation between a critical current density and an inclination angle which is experimentally obtained by using various samples of thin-film superconductors of this invention.

Samples of thin-film superconductors were actually made which had different inclination angles $\theta$ regarding Bi-based ferroelectric films. The samples contained Bi—Sr—Ca—Cu—O superconducting films deposited on the Bi-based ferroelectric films and having a thickness of 100 nm. Experiments were performed on the samples to measure the critical current density thereof at a temperature of 77K. FIG. 8 shows the measured critical current density of the samples which is plotted as a function of the inclination angle $\theta$. From the relation between the critical current density and the inclination angle $\theta$ which is indicated in FIG. 8, the inventors have found that the inclination angle $\theta$ is preferably in the range greater than 0 degree but equal to or smaller than 10 degrees ($0° < \theta \leq 10°$). In addition, the inclination angle $\theta$ is most preferably in the range of 2 degrees to 8 degrees ($2° \leq \theta \leq 8°$).

EXAMPLE 1

With reference to FIG. 1, a thin-film superconductor includes a substrate layer 1 made of a (100)-oriented single crystal of $LaAlO_3$. The thin-film superconductor also includes a thin film 2 of a ferroelectric crystal of the Bi—Ti—O system (for example, $Bi_4Ti_3O_{12}$) which extends on the substrate layer 1. The thin film 2 has a thickness of 100 nm. The thin-film superconductor further includes a thin film 3 of a superconducting compound of the Bi—Sr—Ca—Cu—O system which extends on the thin film 2. The thin film 3 has a thickness of 100 nm.

The thin-film superconductor of FIG. 1 was fabricated as follows. First, a substrate layer 1 made of a (100)-oriented single crystal of $LaAlO_3$ was prepared. A thin film 2 of the Bi—Ti—O system was deposited on the substrate layer 1 by RF magnetron sputtering in which fired ceramics powder was used as a sputtering target. During the deposition of the thin film 2, the pressure of a gas or an atmosphere ($Ar:O_2 = 1:9$) was equal to 5 Pa, and the RF power was equal to 60 W. In addition, the temperature of the substrate layer 1 was 600° C. The thin film 2 had a thickness of 100 nm. Subsequently, a thin film 3 of a superconducting compound of the Bi—Sr—Ca—Cu—O system was deposited on the thin film 2 by RF magnetron sputtering in which fired ceramics powder was used as a sputtering target. During the deposition of the thin film 3, the pressure of a gas or an atmosphere ($Ar:O_2 = 8:2$) was equal to 1 Pa, and the RF power was equal to 60 W. In addition, the temperature of the substrate layer 1 was 650° C. The thin film 3 had a thickness of 100 nm.

A reference thin-film superconductor includes a substrate layer 1 made of a (100)-oriented single crystal of $LaAlO_3$. The reference thin-film superconductor also includes a thin film 3 of a superconducting compound of the Bi—Sr—Ca—Cu—O system which extends on the substrate layer 1. The thin film 3 has a thickness of 100 nm. Thus, the reference thin-film superconductor lacks a thin film 2. During the fabrication of the reference thin-film superconductor, the thin film 3 was formed in a way similar to the way of the formation of the thin film 3 in the thin-film superconductor of FIG. 1.

Figure 2:
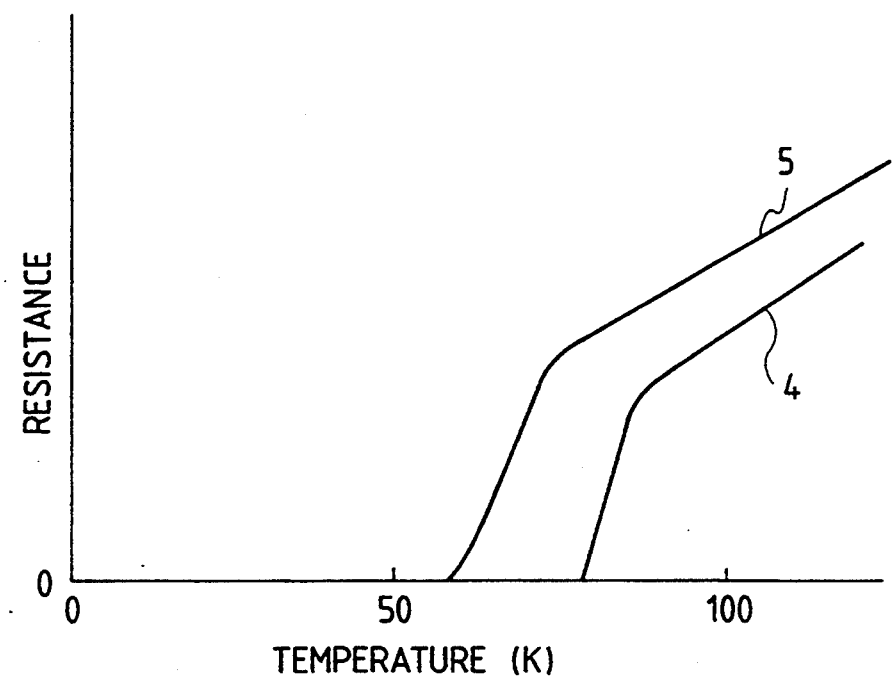
FIG. 2 is a diagram of the temperature dependence of the resistance of a Bi—Sr—Ca—Cu—O film in the first example of the thin-film superconductor according to this invention and the temperature dependence of the resistance of a Bi—Sr—Ca—Cu—O film in a reference thin-film superconductor.

Experiments were performed on the thin-film superconductor of FIG. 1 and the reference thin-film superconductor. Specifically, the resistance of the thin film 3 of the Bi—Sr—Ca—Cu—O system in each of the thin-film superconductor of FIG. 1 and the reference thin-film superconductor was measured at varying temperatures. In FIG. 2, the curved line 4 denotes the experimentally-obtained relation between the temperature and the resistance of the Bi—Sr—Ca—Cu—O film 3 in the thin-film superconductor of FIG. 1, and the curved line 5 denotes the experimentally-obtained relation between the temperature and the resistance of the Bi—Sr—Ca—Cu—O film 3 in the reference thin-film superconductor. The temperature Tc of the Bi—Sr—Ca—Cu—O film 3 in the thin-film superconductor of FIG. 1 is higher than the temperature Tc of the Bi—Sr—Ca—Cu—O film 3 in the reference thin-film superconductor by about 5K. Furthermore, in each of the thin-film superconductor of FIG. 1 and the reference thin-film superconductor, the superconducting critical current density in the thin film 3 of the Bi—Sr—Ca—Cu—O system was measured at a temperature of 50K. In the thin-film superconductor of FIG. 1, the measured result of the superconducting critical current density in the Bi—Sr—Ca—Cu—O film 3 was equal to $5.5 \times 10^5$ A/cm$^2$. In the reference thin-film superconductor, the measured result of the superconducting critical current density in the Bi—Sr—Ca—Cu—O film 3 was equal to $1.0 \times 10^5$ A/cm$^2$.

Figure 3:
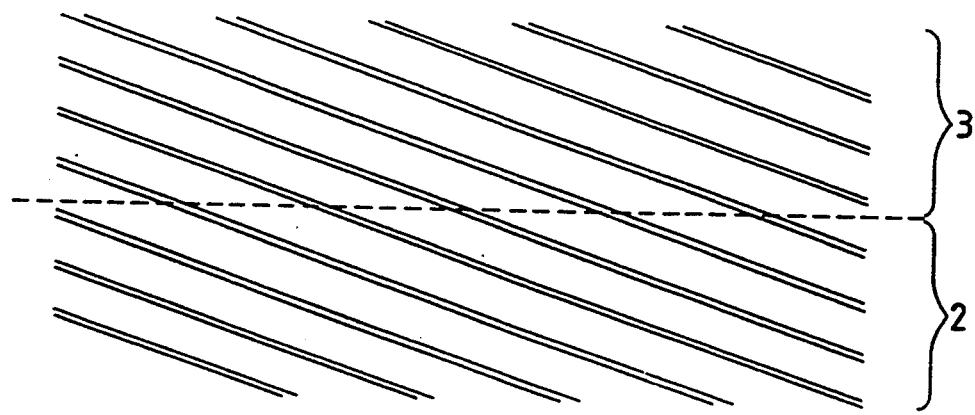
FIG. 3 is a sectional diagram of the boundary between a Bi—Ti—O film and the Bi—Sr—Ca—Cu—O film in the first example of the thin-film superconductor according to this invention.

The thin-film superconductor of FIG. 1 was observed by an x-ray diffraction apparatus and a transmission electron microscope (TEM). Consequently, it was found that the Bi—Ti—O film 2 and the Bi—Sr—Ca—Cu—O film 3 had structures with cross-sections such as shown in FIG. 3. Specifically, the surface of the Bi—Ti—O film 2 extended on a plane inclined with respect to an a-b plane (which is perpendicular to the c-axis) by an angle of about 5 degrees. The surface of the Bi—Sr—Ca—Cu—O film 3 was similarly inclined. The crystal of the Bi—Sr—Ca—Cu—O film 3 was directly connected to a $Bi_2O_2$ layer in the crystal of the Bi—Ti—O film 2. The c-axis unit length of the crystal of the Bi—Sr—Ca—Cu—O film 3 was equal to 3.25 nm, and was equal to that of the crystal of the Bi—Ti—O film 2. It should be noted that the c-axis unit length of a bulk single crystal of the Bi—Sr—Ca—Cu—O system is equal to 3.0 nm.

EXAMPLE 2

A thin-film superconductor according to Example 2 is similar to the thin-film superconductor of Example 1 except that the LaAlO$_3$ substrate layer 1 is replaced by a substrate layer made of a single crystal of MgO, SrTiO$_3$, $\alpha$-Al$_2$O$_3$ (sapphire), MgAl$_2$O$_4$, YSZ, LaGaO$_3$, NdGaO$_3$, YAlO$_3$, Si, GaAs, LaSrGaO$_4$, NdSrGaO$_4$, PrGaO$_3$, or PrAlO$_3$.

EXAMPLE 3

A thin-film superconductor according to Example 3 is similar to the thin-film superconductor of Example 1 except for design changes indicated hereinafter. A substrate layer 1 is made of a single crystal of SrTiO$_3$.

The thin-film superconductor of Example 3 was fabricated as follows. First, a single crystal of SrTiO$_3$ was prepared. The SrTiO$_3$ crystal was cut along a plane which formed an angle of 95 degrees with respect to the c-axis. The exposed surface of the SrTiO$_3$ crystal was polished. The resultant SrTiO$_3$ crystal was used as a substrate layer 1. During a subsequent period, a Bi—Ti—O film 2 and a Bi—Sr—Ca—Cu—O film 3 were sequentially formed on the substrate layer 1 as in Example 1.

EXAMPLE 4

A thin-film superconductor according to Example 4 is similar to the thin-film superconductor of Example 1 except for design changes indicated hereinafter.

The thin-film superconductor of Example 4 was fabricated as follows. First, a substrate layer 1 made of a (100)-oriented single crystal of LaAlO$_3$ was prepared. A single-crystal layer of the Bi—Ti—O system was formed on the substrate layer 1. The Bi—Ti—O single-crystal layer was cut along a plane which formed an angle of 95 degrees with respect to the c-axis. The exposed surface of the Bi—Ti—O layer was polished. The resultant Bi—Ti—O layer was used as a Bi—Ti—O film 2. Subsequently, a thin film 3 of a superconducting compound of the Bi—Sr—Ca—Cu—O system was deposited on the thin film 2 as in Example 1.

EXAMPLE 5

A thin-film superconductor according to Example 5 is similar to the thin-film superconductor of Example 1 except for design changes indicated hereinafter.

In the thin-film superconductor of Example 5, a Bi—Ti—O film 2 and a Bi—Sr—Ca—Cu—O film 3 contact with each other via a plane (an interface) which forms a predetermined angle $\theta$ with respect to a plane perpendicular to the c-axis. For good superconducting characteristics, the angle $\theta$ is preferably in the range as "$0° < \theta \leq 10°$".

EXAMPLE 6

A thin-film superconductor according to Example 6 is similar to the thin-film superconductor of Example 1 except that the Bi—Ti—O film 2 is replaced by a thin film of a ferroelectric crystal of Bi$_2$WO$_6$ or Bi$_2$A$_{m-1}$B$_m$O$_{2m+1}$ where "m" denotes 1, 2, 3, 4, or 5; "A" denotes an element having a valence of 1, an element having a valence of 2, an element having a valence of 3, or a combination thereof; and "B" denotes Ti$^{4+}$, Nb$^{5+}$, Ta$^{5+}$, or a combination thereof.

EXAMPLE 7

A thin-film superconductor according to Example 7 is similar to the thin-film superconductor of Example 1 except for design changes indicated hereinafter.

In the thin-film superconductor of Example 7, Bi—Ti—O layers and Bi—Sr—Ca—Cu—O layers are alternately and periodically laminated at intervals in an atomic order. The thin-film superconductor of Example 7 has stable superconducting characteristics.

EXAMPLE 8

A thin-film superconductor according to Example 8 is similar to the thin-film superconductor of Example 1 except for design changes indicated hereinafter.

The thin-film superconductor of Example 8 was fabricated as follows. A source of oxide containing Bi and a source of oxide containing Ti were prepared. In a vacuum, the Bi oxide and the Ti oxide were vaporized from the respective sources toward a substrate layer 1 to deposit oxide layers on the substrate layer 1. Specifically, a layer of Bi—O was deposited on the substrate layer 1. Then, a layer of Ti—O was deposited on the Bi—O layer. Subsequently, a layer of Bi—O was deposited on the Ti—O layer. These deposition processes were repeated a given number of times so that Bi—O layers and Ti—O layers were alternately and periodically laminated. In addition, activated oxygen gas was introduced and used. As a result, a Bi—Ti—O film 2 was formed on the substrate layer 1.

A source of oxide containing Bi, a source of oxide containing Sr, a source of oxide containing Ca, and a source of oxide containing Cu were prepared. In a vacuum, the Bi oxide, the Sr oxide, the Ca oxide, and the Cu oxide were vaporized from the respective sources toward the substrate layer 1 coated with the Bi—Ti—O film 2 to deposit oxide layers on the Bi—Ti—O film 2. Specifically, a layer of Bi—0 was deposited on the Bi—Ti—O film 2. Then, a layer of Sr—Cu—O deposited on the Bi—O layer, and a layer of Ca—Cu—O layer was deposited on the Sr—Cu—O layer. Subsequently, a layer of Sr—Cu—O was deposited on the Ca—Cu—O layer, and a layer of Bi—O was deposited on the Sr—Cu—O layer. These deposition processes were repeated a given number of times so that Bi—O layers, Sr—Cu—O layers, Ca—Cu—O layers, and Sr—Cu—O layers are sequentially and periodically laminated. As a result, a Bi—Sr—Ca—Cu—O film 3 was formed on the Bi—Ti—O film 2.

EXAMPLE 9

A thin-film superconductor according to Example 9 is similar to the thin-film superconductor of Example 1 except for design changes indicated hereinafter.

In the thin-film superconductor of Example 9, Bi—Ti—O layers and Bi—Sr—Ca—Cu—O layers are periodically laminated. Specifically, the lamination has a periodical structure of m(Bi—Sr—Ca—Cu—O).n(Bi—Ti—O) where "m" and "n" denote given positive integers respectively.

The thin-film superconductor of Example 9 was fabricated as follows. A source of oxide containing Bi, a source of oxide containing Sr and Cu, a source of oxide containing Ca and Cu, and a source of oxide containing Ti were prepared. The Bi oxide, the Sr and Cu oxide, the Ca and Cu oxide, and the Ti oxide were vaporized from the respective sources toward a substrate layer 1 to periodically deposit oxide layers (Bi—O, Sr—

Figure 4:
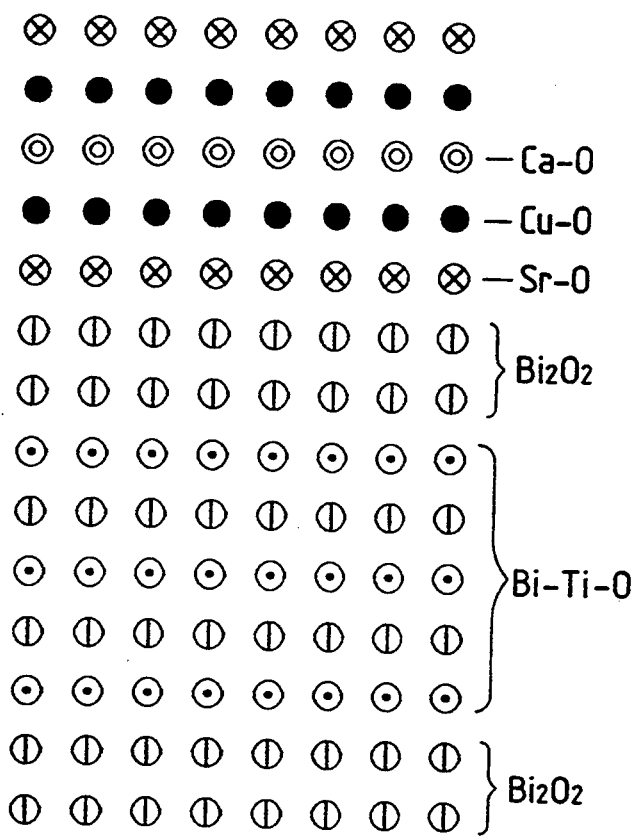
FIG. 4 is a diagram of the structures of a Bi—Sr—Ca—Cu—O crystal and a Bi—Ti—O crystal in a ninth example of a thin-film superconductor according to this invention.

Cu—O, Ca—Cu—O, and Ti—O layers) on the substrate layer 1 as shown in FIG. 4. The deposited oxide layers composed a lamination of Bi—Ti—O layers and Bi—Sr—Ca—Cu—O layers. The Bi—Ti—O layers and the Bi—Sr—Ca—Cu—O layers had very flat surfaces. The a-axis unit length of a perovskite crystal in each Bi—Ti—O layer was approximately equal to that of a crystal in the Bi—Sr—Ca—Cu—O layer. According to this fact, it is thought that a crystal in the Bi—Sr—Ca—Cu—O layer can be continuously grown on a crystal in the Bi—Ti—O layer by epitaxy.

The periodical lamination of Bi—O, Sr—Cu—O, Ca—Cu—O, and Ti—O layers may be formed by an MBE (molecular beam epitaxy) apparatus or a multi-type EB vapor deposition apparatus in which movable shutters in front of sources to be vaporized are suitably controlled, a vapor phase epitaxy apparatus in which gas types are suitably changed, or a sputtering vapor deposition apparatus.

A first example of the sputtering vapor deposition apparatus includes a single sputtering target provided with a given composition distribution. During the formation of the periodical lamination, a discharge area in the sputtering target is periodically controlled.

A second example of the sputtering vapor deposition apparatus includes a plurality of targets having different compositions respectively. During the formation of the periodical lamination, the sputter amounts of the targets are periodically controlled. Movable shutters may be provided in front of the targets. In this case, shutters are periodically closed and opened instead of controlling the sputter amounts of the targets. Alternatively, a substrate (substrate layer 1) may be periodically moved along a path extending above the targets.

A third example of the sputtering vapor deposition apparatus is of the laser beam sputtering type or the ion beam sputtering type in which a plurality of targets are periodically moved to change a target exposed to the beam.

EXAMPLE 10

Figure 5:
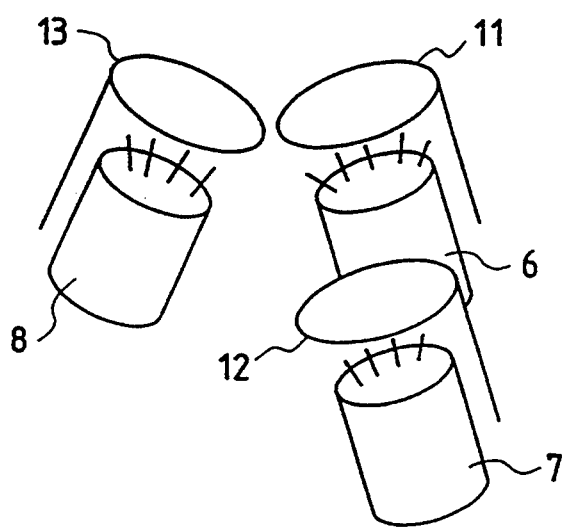
FIG. 5 is a diagram of a magnetron sputtering apparatus used in fabricating a tenth example of a thin-film superconductor according to this invention.

With reference to FIG. 5, a magnetron sputtering apparatus includes a Bi—O target 6, an Sr—Ca—Cu—O target 7, and a Bi—Ti—O target 8. A substrate 9 made of MgO is located above the targets 7, 8, and 9. The axes of the targets 6, 7, and 8 are inclined at angles of about 30 degrees with respect to the vertical direction toward the substrate 9 so that focal points related to the targets will exit on the substrate 9. The substrate 9 can be heated by a heater 10. A movable shutter 11 is disposed in a path between the Bi—O target 6 and the substrate 9. The shutter 11 extends in front of the Bi—O target 6. A movable shutter 12 is disposed in a path between the Sr—Ca—Cu—O target 7 and the substrate 9. The shutter 12 extends in front of the Sr—Ca—Cu—O target 7. A movable shutter 13 is disposed in a path between the Bi—Ti—O target 8 and the substrate 9. The shutter 13 extends in front of the Bi—Ti—O target 8.

A thin-film superconductor according to Example 10 was fabricated by using the magnetron sputtering apparatus of FIG. 5. Specifically, a single crystal of MgO was prepared. The MgO crystal was processed or cut so that an exposed surface thereof was inclined with respect to a (100) plane by an angle of 5 degrees. The resultant MgO crystal was used as a substrate 9 placed into the magnetron sputtering apparatus. While the substrate 9 was continuously heated at a temperature of about 600° C. by the heater 10, the targets 6, 7, and 8 were subjected to sputtering in an atmosphere of a mixture of argon and oxygen (5:1) which had a pressure of 3 Pa. During the sputtering, RF powers fed to the targets 6, 7, 8 were equal to 30 W, 60 W, and 60 W respectively.

In more detail, the shutters 11 and 13 were sequentially controlled so that Bi—O vapor, Bi—Ti—O vapor, and Bi—O vapor were sequentially reached the substrate 9 from the targets 6 and 8. As a result, a layer of the Bi—Ti—O system was deposited on the substrate 9. The effective sputter times of the targets 6 and 8 were adjusted so that the element composition ratio in the Bi—Ti—O layer was 4:3 (Bi:Ti). The sequence of the above-mentioned steps to form a Bi—Ti—O layer was repeated twenty times (twenty cycles). In this way, a thin film of the Bi—Ti—O system was formed on the substrate 9. Subsequently, the temperature of the substrate 9 with the Bi—Ti—O film was increased to 650° C. by controlling the heater 10. While the the temperature of the substrate 9 was held at 650° C., the shutters 11 and 12 were sequentially controlled so that Bi—O vapor, Sr—Ca—Cu—O vapor, and Bi—O vapor were sequentially reached the substrate 9 from the targets 6 and 7. As a result, a layer of the Bi—Sr—Ca—Cu—O system was deposited on the Bi—Ti—O film. The sequence of the above-mentioned steps to form a Bi—Sr—Ca—Cu—O layer was repeated twenty times (twenty cycles). In this way, a thin film of the Bi—Sr—Ca—Cu—O system was formed on the Bi—Ti—O film.

Figure 6:
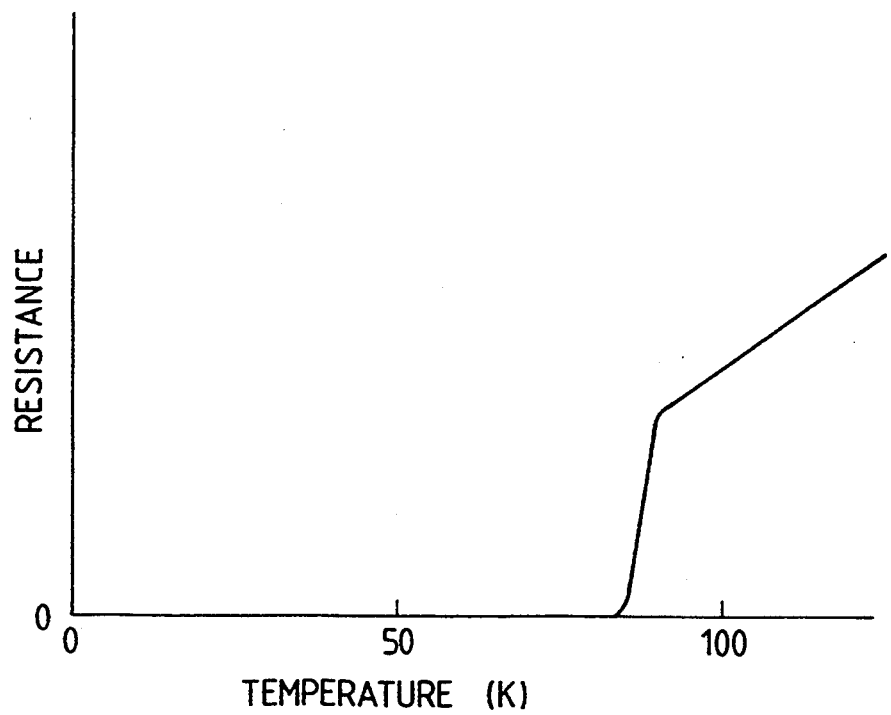
FIG. 6 is a diagram of the temperature dependence of the resistance of a Bi—Sr—Ca—Cu—O film in the tenth example of the thin-film superconductor according to this invention.

Experiments were performed on the thin-film superconductor of Example 10. Specifically, the resistance of the thin film of Bi—Sr—Ca—Cu—O in the thin-film superconductor of Example 10 was measured at varying temperatures. In FIG. 6, the curved line denotes the experimentally-obtained relation between the temperature and the resistance of the Bi—Sr—Ca—Cu—O film in the thin-film superconductor of Example 10. It was found that the temperature Tc of the Bi—Sr—Ca—Cu—O film in the thin-film superconductor of Example 10 was higher than the temperature Tc of the Bi—Sr—Ca—Cu—O film in the thin-film superconductor of Example 1. In addition, the Bi—Sr—Ca—Cu—O film in the thin-film superconductor of Example 10 was better in critical current density than the Bi—Sr—Ca—Cu—O film in the thin-film superconductor of Example 1.

EXAMPLE 11

A thin-film superconductor according to Example 11 is similar to the thin-film superconductor of Example 10 except that the MgO substrate is replaced by a substrate made of a single crystal of $SrTiO_3$, $\alpha$-$Al_2O_3$ (sapphire), $MgAl_2O_4$, YSZ, $LaGaO_3$, $LaAlO_3$, $NdGaO_3$, $YAlO_3$, Si, GaAs, $LaSrGaO_4$, $NdSrGaO_4$, $PrGaO_3$, or $PrAlO_3$.

What is claimed is:

1. A thin-film superconductor comprising:
   a substrate;
   a ferroelectric film extending on the substrate and being comprised of a crystal containing Bi and O; and
   a superconducting oxide film extending on the ferroelectric film and containing Bi, Cu and an alkaline-earth metal element;
   wherein a boundary between the ferroelectric film and the superconducting oxide film extends along a plane nonperpendicular to a c-axis of the superconducting oxide film, and said plane along which said boundary extends is inclined at an angle with respect to a plane perpendicular to the c-axis of the ferroelectric film, and the angle is greater than 0 degree but equal to or smaller than 10 degrees.

2. The thin-film superconductor of claim 1, wherein the superconducting oxide film contains at least two different alkaline-earth metal elements.

3. The thin-film superconductor of claim 1, wherein the substrate is comprised of a crystal selected from the group consisting of a crystal of $LaAlO_3$, a crystal of MgO, a crystal of $SrTiO_3$, a crystal of $\alpha$-$Al_2O_3$, a crystal of $MgAl_2O_4$, a crystal of YSZ, a crystal of $LaGaO_3$, a crystal of $NdGaO_3$, a crystal of $YAlO_3$, a crystal of Si, a crystal of GaAs, a crystal of $LaSrGaO_4$, a crystal of $NdSrGaO_4$, a crystal of $PrGaO_3$, and a crystal of $PrAlO_3$.

4. The thin-film superconductor of claim 1, wherein the substrate is comprised of a (100)-oriented crystal of $LaAlO_3$.

5. The thin-film superconductor of claim 1, wherein the crystal of the ferroelectric film further contains Ti.

6. The thin-film superconductor of claim 1, wherein the crystal of the ferroelectric film comprises a crystal of $Bi_4Ti_3O_{12}$.

7. The thin-film superconductor of claim 1, wherein the crystal of the ferroelectric film comprises a crystal of $Bi_2WO_6$.

8. A thin-film superconductor comprising:
a substrate;
a ferroelectric film extending on the substrate and comprised of a crystal containing Bi and O; and
a superconducting oxide film extending on the ferroelectric film and containing Bi, Cu and an alkaline-earth metal element;
wherein a boundary between the ferroelectric film and the superconducting oxide film extends along a plane inclined at an angle with respect to a plane perpendicular to a c-axis of the ferroelectric film, and the angle is greater than 0 degrees but equal to or smaller than 10 degrees.

9. A thin-film superconductor comprising:
a substrate;
a ferroelectric film extending on the substrate and comprised of a crystal containing Bi and O; and
a superconducting oxide film extending on the ferroelectric film and containing Bi, Cu and an alkaline-earth metal element;
wherein a boundary between the ferroelectric film and the superconducting oxide film extends along a plane inclined at an angle with respect to a plane perpendicular to a c-axis of the ferroelectric film, and the angle is in a range of 2 degrees to 8 degrees.

10. A thin-film superconductor comprising;
a substrate;
a ferroelectric film extending on the substrate and being comprised of a crystal containing Bi and O; and
a superconducting oxide film extending on the ferroelectric film and containing Bi, Cu, and an alkaline-earth metal element;
wherein e boundary between the ferroelectric film and the superconducting oxide film extends along a plane nonparallel and nonperpendicular to the c-axis of the superconducting oxide film, and said plane along which said boundary extends is inclined at an angle with respect to a plane perpendicular to the c-axis of the ferroelectric film, and the angle is greater than 0 degrees but equal to or smaller than 10 degrees.

11. The thin-film superconductor of claim 10, wherein the superconducting oxide film contains at least two different alkaline-earth metal elements.

12. The thin-film superconductor of claim 10, wherein the crystal of the ferroelectric film further contains Ti.

13. The thin-film superconductor of claim 10, wherein the crystal of the ferroelectric film comprises a crystal of $Bi_4Ti_3O_{12}$.

14. The thin-film superconductor of claim 10, wherein the crystal of the ferroelectric film comprises a crystal of $Bi_2WO_6$.

15. A thin-film superconductor comprising:
a substrate;
a ferroelectric film extending on the substrate and comprised of a crystal containing Bi and O; and
a superconducting oxide film extending on the ferroelectric film and containing Bi, Cu and an alkaline-earth metal element;
wherein a boundary between the ferroelectric film and the superconducting oxide film extends along a plane nonparallel to a c-axis of the superconducting oxide film, and said plane along which said boundary extends is inclined at an angle with respect to a plane perpendicular to the c-axis of the ferroelectric film, and the angle is greater than 0 degrees but equal to or smaller than 10 degrees.

16. A thin-film superconductor comprising:
a substrate;
a ferroelectric film extending on the substrate and being comprised of a crystal containing Bi and O; and
a superconducting oxide film extending on the ferroelectric film and containing Bi, Cu and an alkaline-earth metal element;
wherein a boundary between the ferroelectric film and the superconducting oxide film extends along a plane nonparallel to a c-axis of the superconducting oxide film, and said plane along which said boundary extends is inclined at an angle with respect to a plane perpendicular to the c-axis of the ferroelectric film, and the angle is in a range of 2 degrees to 8 degrees.

17. The thin-film superconductor of claim 1, wherein said angle is in a range of 2 degrees to 8 degrees.

18. The thin-film superconductor of claim 10, wherein said angle is in a range of 2 degrees to 8 degrees.

* * * * *